United States Patent [19]

O'Connor et al.

[11] Patent Number: 4,590,395
[45] Date of Patent: May 20, 1986

[54] FET-BIPOLAR DRIVE CIRCUIT

[75] Inventors: Donald F. O'Connor, Ramsey, Minn.; Zoltan Zansky, Willowdale, Canada

[73] Assignee: Honeywell Inc., Minneapolis, Minn.

[21] Appl. No.: 632,578

[22] Filed: Jul. 20, 1984

[51] Int. Cl.[4] .................. H03K 17/60; H03K 19/08; H03K 3/33
[52] U.S. Cl. .................. 307/570; 307/280; 307/300; 307/315
[58] Field of Search ............... 307/270, 300, 315, 280, 307/570, 253, 574, 581

[56] References Cited

U.S. PATENT DOCUMENTS

| | | | |
|---|---|---|---|
| 2,989,652 | 6/1961 | Hall | 307/253 |
| 4,367,421 | 1/1983 | Baker | 307/570 |

OTHER PUBLICATIONS

Carpenter, et al.; "A New Universal Proportional Drive Technique for High Voltage Switching Transistors", Proceeding of Powercon 8, Power Concepts Inc., 1981, pp. 1-15.
Gregorich, et al.; "Designing Switched-Mode Converters with a New Proportional Base Drive Technique", Digital Equipment Corp., Maynard, Mass., pp. E2-1,--E2-8.
Farrow, et al.; "A 300K Hz Off-Line Switching Supply Using a Unique Bi-Mos Switch Combination", Power Conversion International, pp. 20-27, 1980.
Barlage; "A New Switched-Mode Converter Technique Combines VMOS and Bipolar", Woodward Governor Co. pp. D2-1,-D2-8.

Primary Examiner—Stanley D. Miller
Assistant Examiner—B. P. Davis
Attorney, Agent, or Firm—Charles G. Mersereau

[57] ABSTRACT

The present invention provides a low-cost switching system that allows very high speed ON and OFF switching of a bipolar power transistor. The switching system of the present invention consists of an FET-bipolar transistor combination which unites the advantages of FET and bipolar power transistors for extremely fast switching applications. The system draws negligible steady-state drive power and still turns the bipolar transistor fast ON and fast OFF.

2 Claims, 6 Drawing Figures

FET-BIPOLAR DRIVE CIRCUIT

BACKGROUND OF THE INVENTION

1. Field of the Invention

The present invention relates generally to the rapid switching of power transistors and, more particularly, to an FET-Bipolar switch which has the ability to turn a power transistor ON and OFF at a very high rate.

2. Description of the Prior Art

Bipolar transistors operating in the so-called "dump cycle" flyback mode at high frequencies (above 1 kHz) with inductive loads such as most brushless DC motor drives, require "proportional" base drives for operation at the highest efficiencies. The worst case operation of the above transistors is when the drive is PWM-controlled, where the transistors must be switched ON and OFF at much higher frequencies which are typically 1–20 kHz and must operate at close square-wave collector currents. In order to accomplish this, prior art base drive circuits require a base drive which starts with a current spike, followed by $1/\beta$ times the collector current, and a high negative base current spike at turn-off, to promote fast turn-off. Such circuits are generally rather complex, expensive, and most of the transformer couple proportional base drive circuits of the prior art are useless in brushless DC motor drives, for example, as they cannot provide continuous base drive current at low RPM's. In addition, these circuits draw substantial base currents which results in a high average power supply current, which means increased cost and loss of an additional power supply.

In the prior art, it is known to use field-effect transistors (FET's) to drive bipolar switching power transistors. One such system utilizes one MOS hex inverter buffer, one low-voltage FET, and one high-voltage FET to switch a bipolar transistor. While such a circuit appears to function satisfactorily, it does not provide the desirable fast turn-off of the transistor inasmuch as it doesn't provide a good turn-on or turn-off current spike into the bipolar base. This limits the switching speed of the power transistor such that it cannot be used where very high speed switching is a requirement such as is the case in a brushless motor drive.

SUMMARY OF THE INVENTION

By means of the present invention there is provided a low-cost switching system that allows very high speed ON and OFF switching of a bipolar power transistor. In the preferred embodiment, the switching system of the present invention consists of an proportional base driven FET-bipolar transistor combination which unites the advantages of FET and bipolar power transistors for extremely fast switching applications. The system draws negligible steady-state drive power an still turns the bipolar transistor fast ON and fast OFF.

The preferred embodiment utilizes a single FET connected to the control input voltage signal through a parallel R-C circuit together with a Zener diode in parallel with an FET input to provide extremely fast switching of the bipolar transistor. The control voltage signal, which may be a pulse width modulated (PWM) signal of a frequency of, for example, 1–20 kHz, is applied to the gate terminal of the FET. The source and drain terminals of the FET are connected to the base and collector of the bipolar power transistor, respectively. The Zener diode is connected across the gate and source terminals of the FET. A high value resistor is provided in parallel with the capacitor, and a low value resistor may be connected across the base and emitter of the bipolar power transistor.

DESCRIPTION OF THE PREFERRED EMBODIMENT

Figure 1:
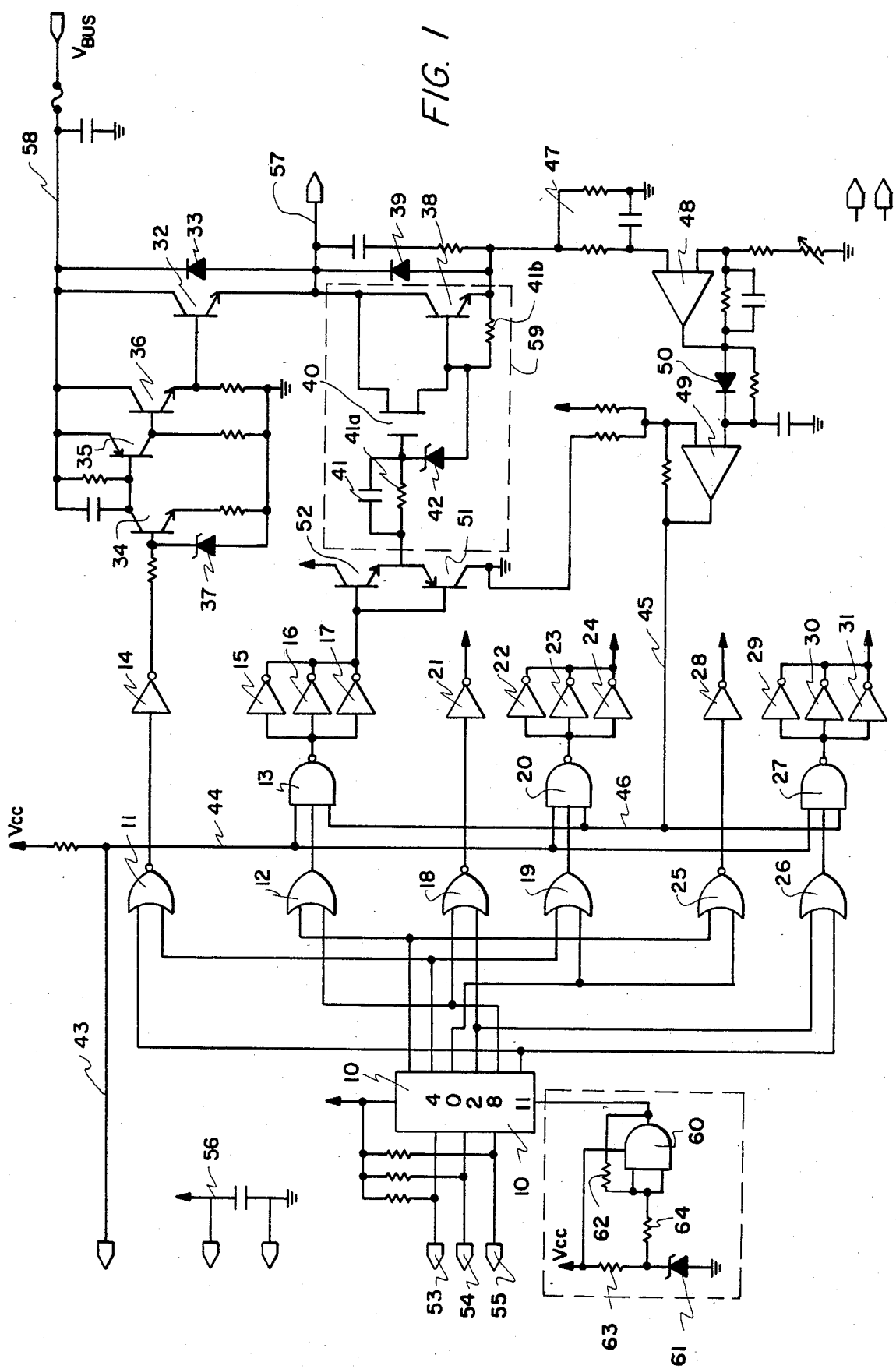
FIG. 1 is a schematic circuit diagram of a three-phase brushless DC motor drive including the FET-Bipolar-Darlington fast switch of the invention.

FIG. 1 shows a schematic circuit drawing of a basic circuit used in a three-phase DC brushless motor drive which includes the FET-Bipolar Darlington switch of the present invention. The circuit is generally conventional and includes a decoder or three-bit binary to octal converter IC 10, which may be a Motorola 4028 IC, or the like. Outputs from the IC are connected to NOR gate 11 and OR gate 12 and these together with NAND gate 13 and inverters 14 through 17 provide the switching logic for one phase of the three-phase drive system. Similarly, NOR gate 18, OR gate 19, NAND gate 20 and inverters 21 through 24 and NOR gate 25, OR gate 26, NAND gate 27 and inverters 28 through 31 provide the switching logic for the other two phases. The switching circuits and associated bipolar power transistors are illustrated for but one of these phases inasmuch as the other two are identical.

Each phase includes an upper switching power transistor as at 32 with associated parallel diode 33. The power transistor 32 is turned on and off by a switching circuit including transistors 34, 35 and 36 together with Zener diode 37. A lower, PWM-modulated bipolar switching power transistor 38 with an associated parallel diode 39 is provided. The transistor 38 is switched by the very fast unique FET-Bipolar switch of the invention shown by the broken line 59 which includes FET 40, capacitor 41, resistors 41a and 41b and Zener diode 42. This switch, as will be described in greater detail below, enables the power transistor 38 to be turned on and off very rapidly by allowing it to rapidly charge and discharge capacitor 41 through Zener diode 42.

The switching circuit associated with the bipolar power transistor 32 operates in response to the logic signal output of inverter 14. The control or operating circuit associated with the bipolar power transistor 38 includes a pulse width modulated (PWM) high frequency speed control input signal on line 43 which connects to one input of the NAND gates including gate 13 via line 44. A further signal to another input of the inverters including gate 13 on lines 45 and 46 is supplied from a current limit circuit which includes current sensing circuit 47 with amplifiers 48 and 49 and diode 50. The drive signal is modulated by the outputs of the emitters of transistors 51 and 52. Transistors 51 and 52 in association with inverters 15 through 17 produce a square-wave output which drives the FET-Bipolar switch. Other logic input from Hall effect sensors on lines 53 through 55 are located 120° apart and sense the position of the motor armature in a well known manner. A DC power supply is depicted at 56.

Figure 2:
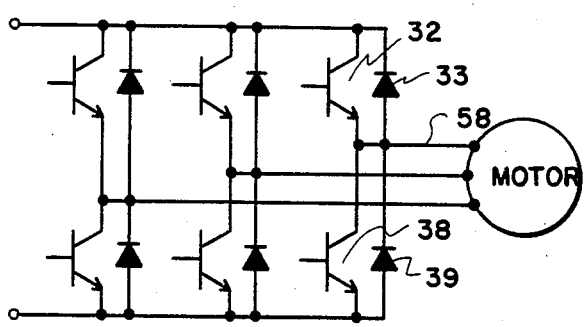
FIG. 2 is a simplified view of the three-phase motor drive of FIG. 2.

A simplified presentation of the three-phase input is shown in FIG. 2. The output to the motor operates basically as a three-phase, bridge inverter.

A failsafe power-up/power-down logic switch is connected to the inhibit pin of the IC 10 in the circuit of FIG. 1. The switch includes AND gate 60, Zener diode 61, feedback resistor 62 and resistors 63 and 64. The switch itself is the subject of a separate patent application Ser. No. 632,788 filed of even date and assigned to the same assignee as the present application.

The logic switch operates in a manner that assures that all of the logic signal outputs from the logic decoder, and therefore, the drive signals to the power switches are in the inhibited or the OFF state until all the other logic is in the desired defined initial state to begin operation of the controlled circuit. During operation of the control circuit, the switch does not interfere with the normal operation of the decoder circuit. During power-down, the failsafe switch again controls the logic signal outputs from the logic decoder such that the drive signals to the power switches are again in the OFF state.

Figure 3:
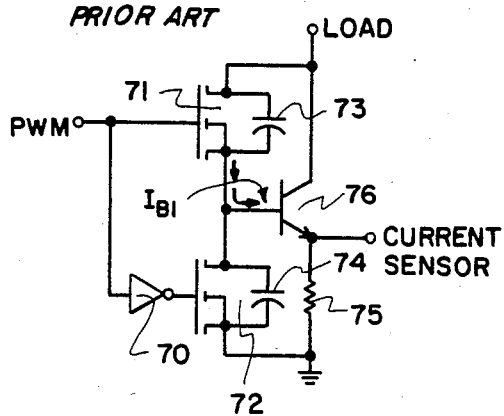
FIG. 3 is a view of a prior art switching circuit.

One such drive circuit is illustrated in FIG. 3. It consists of MOS hex inverter buffer 70, high-voltage FET 71 and low-voltage FET 72, together with respective associated capacitors 73 and 74 and resistor 75. This is used to switch bipolar power transistor 76. The drive is approximately proportional since FET 71 supplies increased drive as more current is handled by bipolar power transistor 76. With an inductive, increasing load on bipolar power transistor 76, FET 71 increases the base drive to bipolar power transistor 76 as the gain of the bipolar power transistor decreases.

Antisaturation is provided by FET 71 as it maintains the collector-emitter voltage of transistor 76 slightly higher than $I_{B1}$ times the ON-resistance of transistor 76. With an inductive load on FET 71 near saturation will occur at turn-on. However, as $I_{B1}$ increases, transistor 76 moves farther from saturation. This provides a fairly fast turn-off time at the highest current levels. Reverse bias at turn-off is provided by resistor 75. When the control output goes low, FET 71 turns OFF and FET 72 turns ON. Transistor 76 is still passing current through resistor 75 during this transition so the base-emitter junction of transistor 76 is effectively back-biased in proportion to its loading. This removes whatever minority carriers are left in transistor 76, shutting it off.

While the drive circuit of FIG. 3 is not as complex as some prior art drives, it doesn't turn OFF as fast as is desirable for a PWM application. The circuit does not provide any large turn-on or turn-off current spikes.

Figure 5:
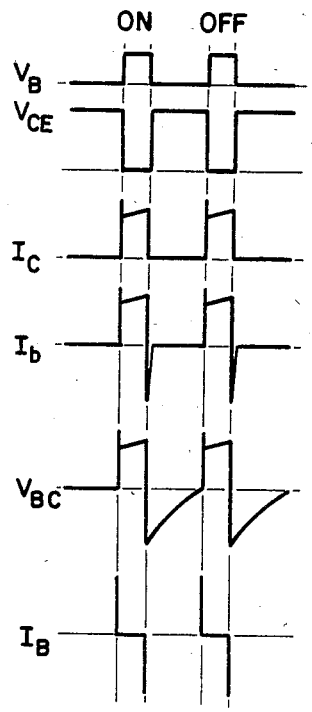
FIG. 5 is a series of graphs showing the relationship between the voltages and current of the FET-bipolar switch of the invention.
Figure 4:
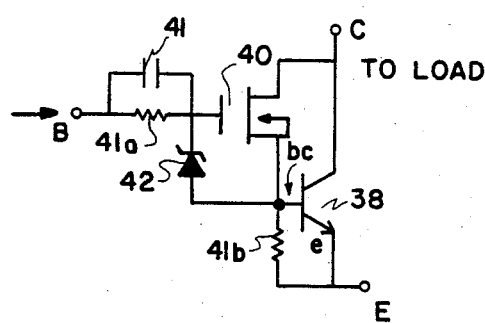
FIG. 4 is an isolated view of the switch of the invention.
Figure 6:
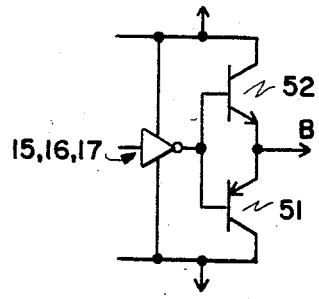
FIG. 6 is an isolated view of a square-wave control voltage source for the switch of FIG. 4.

The Bipolar-Darlington fast switch of the invention, which requires but a single FET is illustrated on FIG. 4 and the square-wave drive voltage source for the switch is shown in FIG. 6. Diagrams of relevant voltages and currents are illustrated in FIG. 5.

The B input of the switch, as shown in FIG. 4, is driven by the square-wave voltage output from the circuit of FIG. 6. As seen in FIG. 5, when the voltage at the B input goes high, it should be higher than the Zener voltage plus the forward biased base-emitter (b-e) junction voltage of transistor 38. Thus, the capacitor 41 rapidly charges into the base of transistor 38, assuring its rapid turn on. At the same time, the Gate-Source (G-S) junction of FET 40 will see the Zener voltage, the value of which is chosen to saturate the FET immediately to assure a continued supply of base current, $I_b$, to transistor 38 from the collector of transistor 38 in the manner of a Darlington drive transistor. This will occur even when no more base current flows from the charged up capacitor 41. Resistor 41a is a high ohmic value resistor (typically 1-10 k ohm) and assures that the Gate-Source junction of FET 41 will be supplied with Zener voltage to compensate against leakage currents through the Zener diode and the Gate-Source junction of the FET 40. As the $I_c$ rises, $U_{c-e}$ of transistor 38 also rises and, thus, the voltage across the Drain-Source (D-S) junction of FET 40 which acts like a resistor in ON state will then supply more base drive current $I_b$ to transistor 38 proportionally with $U_{c-e}$, and $I_c$. At the same time, this operation also eliminates saturation of the transistor 38 thereby minimizing storage time delay.

Conversely, when the voltage of B is switched to low (zero), then capacitor 41 (which was charged to $V_B$, minus the Zener voltage, minus $V_{B-E}$ forward typically 3–4 V will then discharge into the base of transistor 38 through the forward based diode junction of the Zener diode. This results in a negative base current spike to transistor 38 which turns it OFF very rapidly. The capacitor 41 will continue to discharge through resistor 41b until the ON drive is again at high B input. At the same time the Zener diode will be reverse biased (its diode junction forward biased), the Gate-Source saturating voltage of the FET 40 will change to the reverse voltage of the Zener diode 42, (−0.7 volts, typically) This assures that the FET will turn immediately OFF and will stay OFF until the voltage at B switches to ON or high again. The current at the B output of FIG. 6 will be as illustrated in FIG. 5. It is readily seen that the average value of the drive current is very low, enabling the complete drive circuit to be powered from a very small power supply direct form the motor DC-bus as by an inexpensive linear regulator.

While component values will necessarily vary with the particular application, in successful embodiments of the brushless DC motor drive of FIG. 1, resistor 41a was 10 K ohm, capacitor 41 had a value between 0.1 and 0.68 F and the Zener voltage was from 5 to 10 volts.

Thus, the new FET-Bipolar switch of the invention provides the required high speed proportional base drive without any of the disadvantages of the other known methods, and with very low average power supply current.

The embodiments of the invention in which an exclusive property or right is claimed are defined as follows:

1. A proportional base bipolar switch drive circuit comprising:
    a source of modulated control voltage;
    a bipolar switching transistor;
    a single FET having a gate connected to the modulated control voltage through a parallel R-C circuit, a source connected to the base of the bipolar transistor and a drain connected to the collector of the bipolar transistor;
    a Zener diode connected in parallel with the FET gate and source terminals and between the parallel R-C circuit and the base of the bipolar transistor;
    resistance means connected between the Zener diode and ground and across the base-emitter junction of said bipolar transistor.

2. The bipolar switch drive circuit of claim 1 wherein said control voltage is in the form of a PWM square-wave.

* * * * *